United States Patent
Dakshina-Murthy et al.

(10) Patent No.: US 7,183,152 B1
(45) Date of Patent: *Feb. 27, 2007

(54) EPITAXIALLY GROWN FIN FOR FINFET

(75) Inventors: Srikanteswara Dakshina-Murthy, Austin, TX (US); Chih-Yuh Yang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 190 days.

This patent is subject to a terminal disclaimer.

(21) Appl. No.: 10/975,475

(22) Filed: Oct. 29, 2004

Related U.S. Application Data

(62) Division of application No. 10/633,499, filed on Aug. 5, 2003, now Pat. No. 6,835,618.

(51) Int. Cl.
- H01L 21/336 (2006.01)
- H01L 21/8234 (2006.01)
- H01L 21/00 (2006.01)
- H01L 21/84 (2006.01)
- H01L 21/3205 (2006.01)

(52) U.S. Cl. .................. 438/197; 438/149; 438/283; 438/592

(58) Field of Classification Search ............ 438/149, 438/157, 151, 283, 588, 592, 197
See application file for complete search history.

(56) References Cited

U.S. PATENT DOCUMENTS

| | | | |
|---|---|---|---|
| 6,709,982 B1 | 3/2004 | Buynoski et al. | 438/696 |
| 6,835,618 B1 * | 12/2004 | Dakshina-Murthy et al. | 438/256 |
| 6,855,583 B1 * | 2/2005 | Krivokapic et al. | 438/157 |
| 2003/0197194 A1 | 10/2003 | Fried et al. | 257/200 |
| 2004/0075122 A1 | 4/2004 | Lin et al. | 257/288 |

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

* cited by examiner

*Primary Examiner*—Chuong Anh Luu
(74) *Attorney, Agent, or Firm*—Harrity Snyder LLP

(57) ABSTRACT

A method of forming a fin for a fin field effect transistor (FinFET) includes defining a trench in a layer of first material, where a width of an opening of the trench is substantially smaller than a thickness of the layer. The method includes growing a second material in the trench to form the fin and removing the layer of first material.

17 Claims, 14 Drawing Sheets

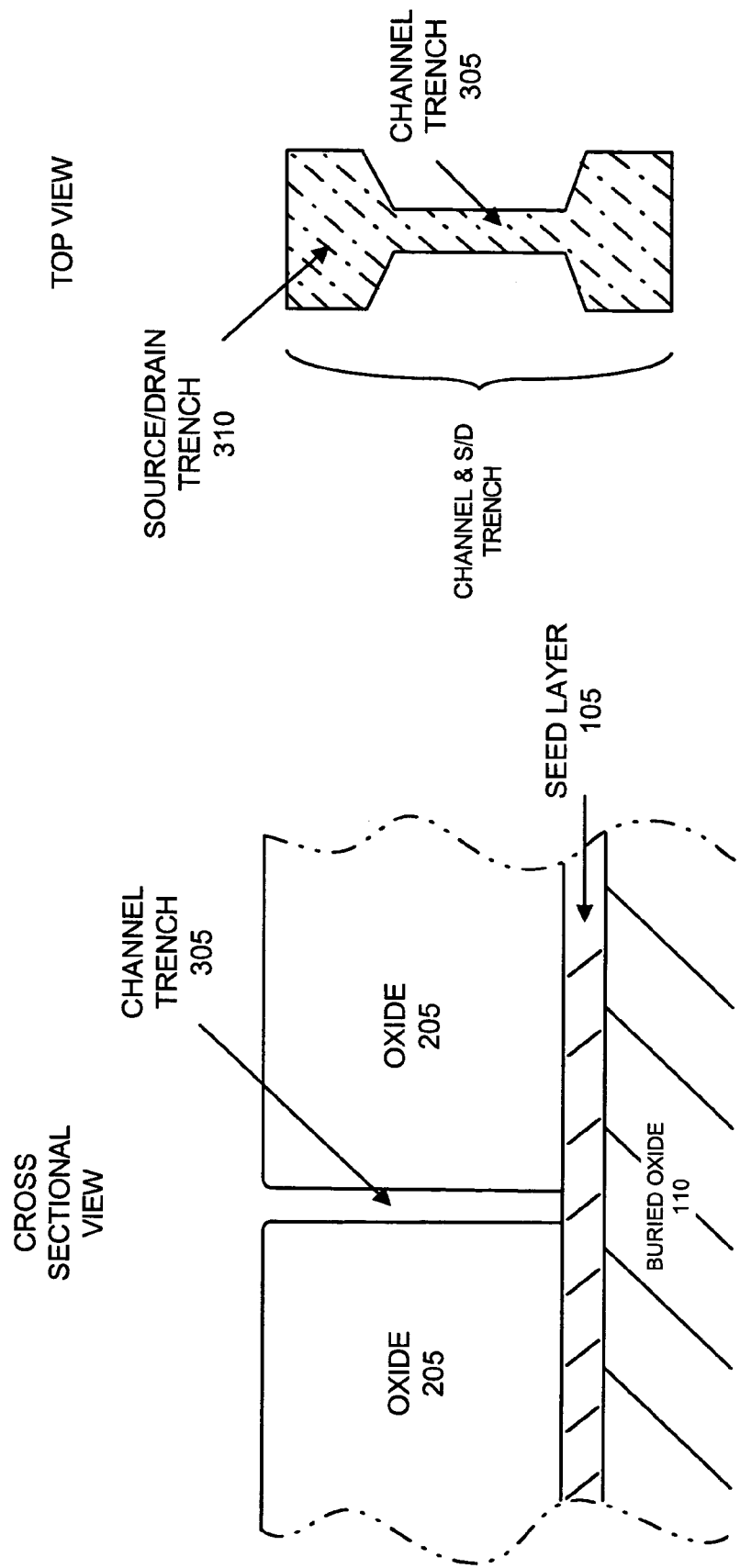

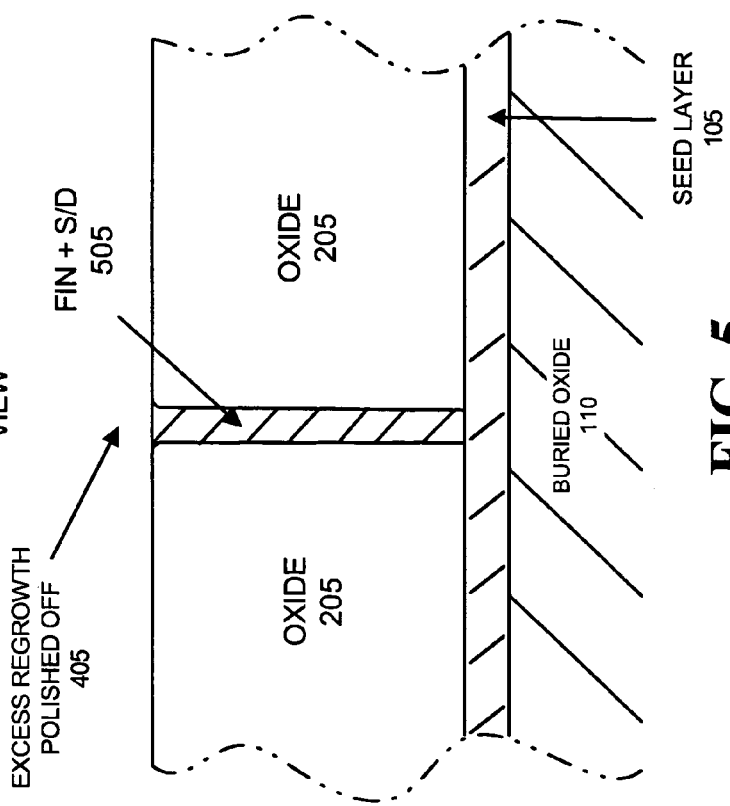
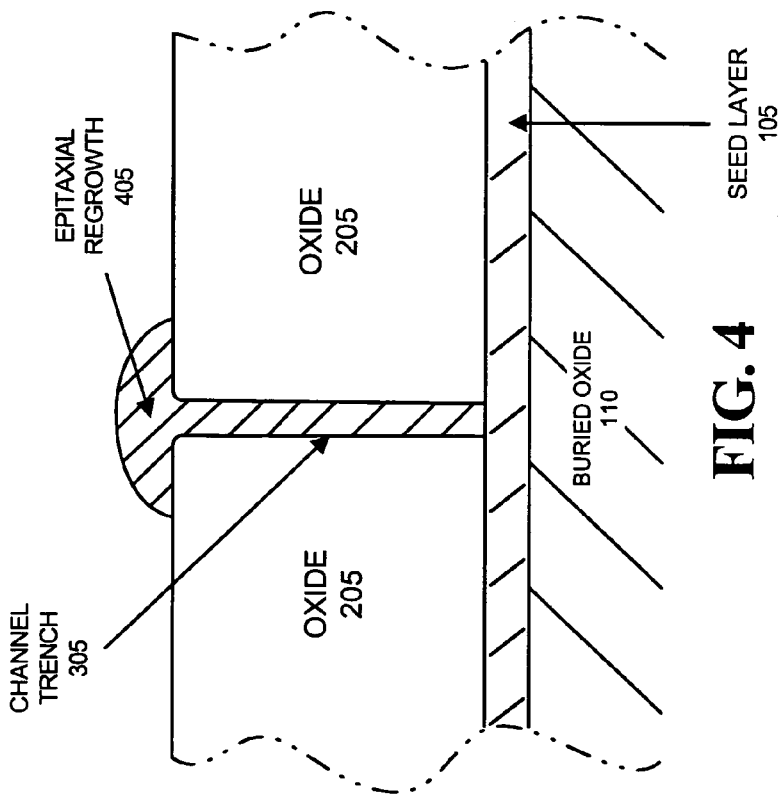

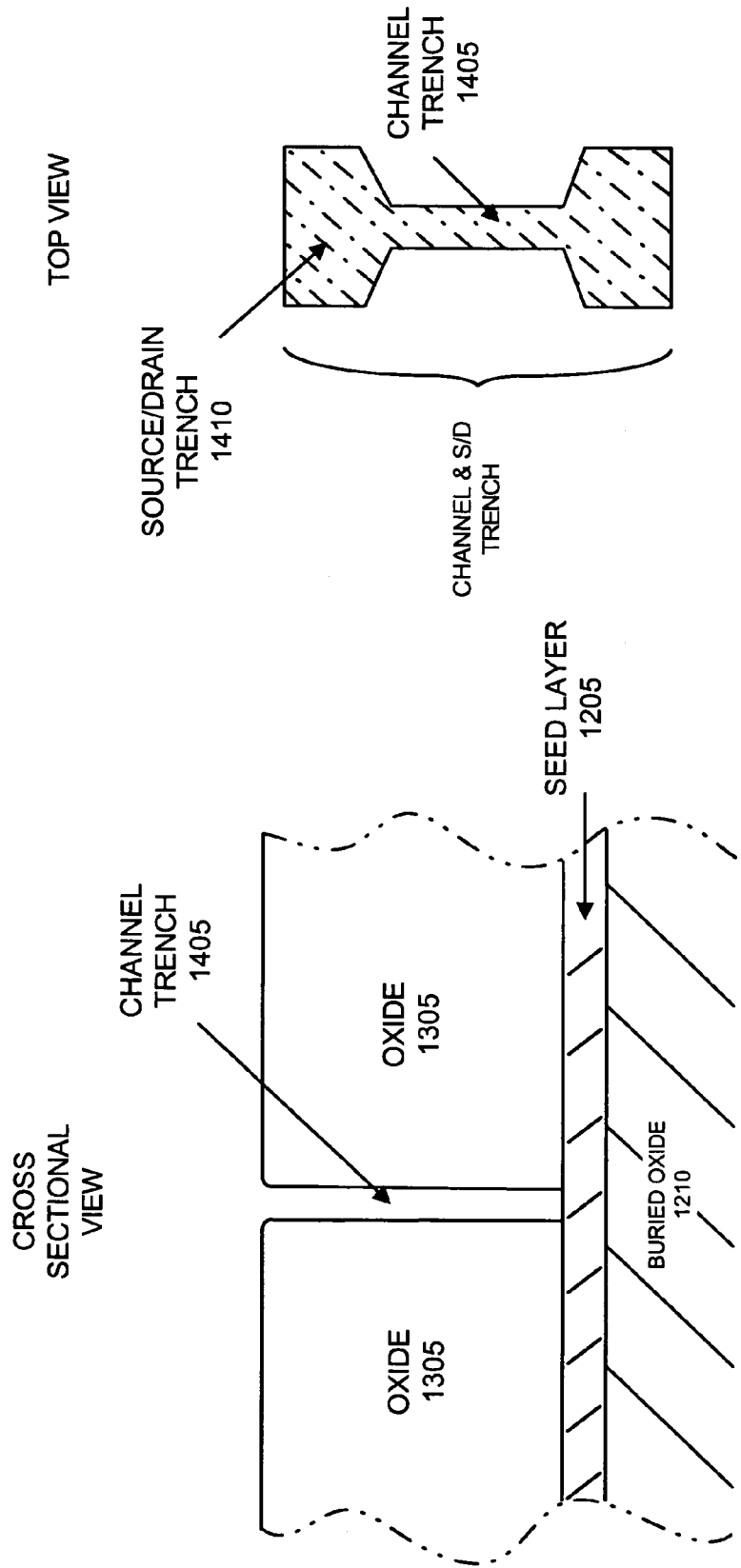

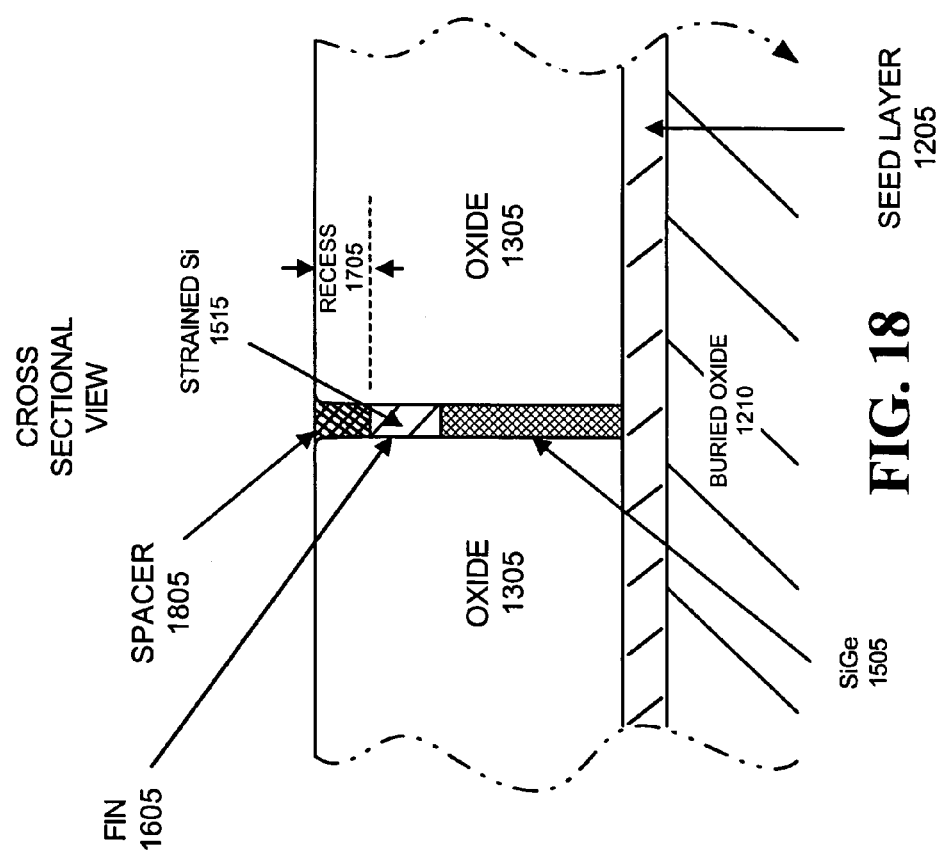
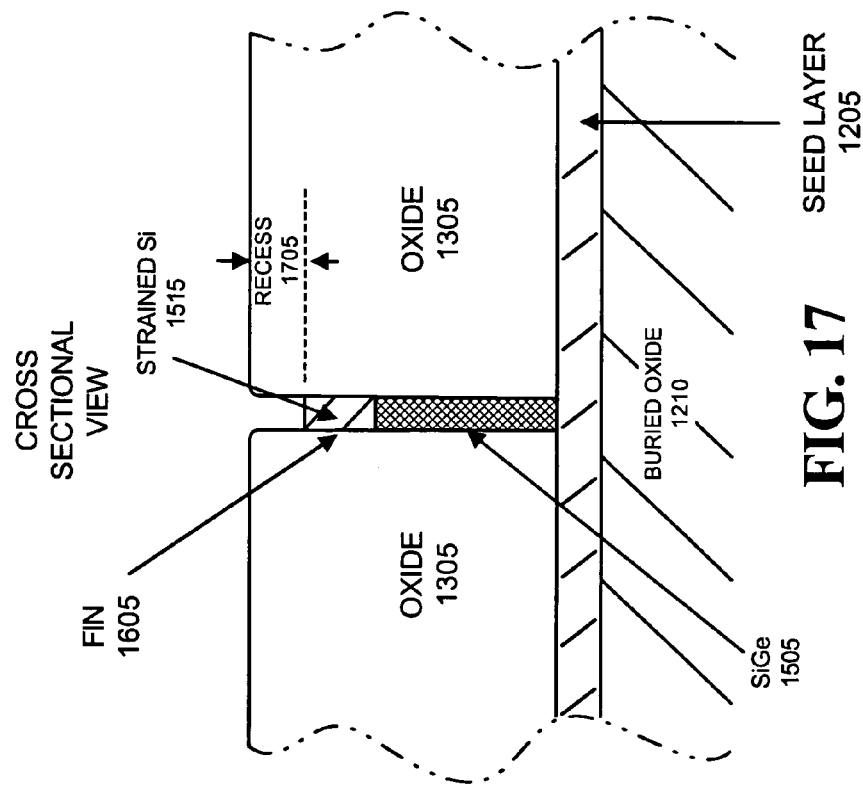

CROSS
SECTIONAL
VIEW

LINER REMOVAL TO
EXPOSE SPACER
2005

SPACER
1805

FIN + S/D
1605

LINER
1905

STRAINED Si
1515

SiGe
1505

BURIED OXIDE
1210

SEED LAYER
1205

FIG. 20

CROSS
SECTIONAL
VIEW

LINER
1905

SPACER
1805

FIN + S/D
1605

STRAINED Si
1515

SiGe
1505

BURIED OXIDE
1210

SEED LAYER
1205

FIG. 19

EPITAXIALLY GROWN FIN FOR FINFET

CROSS REFERENCE TO RELATED APPLICATION

The present application is a divisional of U.S. application Ser. No. 10/633,499, filed Aug. 5, 2003 now U.S. Pat. No. 6,835,618, the disclosure of which is incorporated by reference herein in its entirety.

TECHNICAL FIELD

The present invention relates generally to transistors and, more particularly, to fin field effect transistors (FinFETs).

BACKGROUND ART

Scaling of device dimensions has been a primary factor driving improvements in integrated circuit performance and reduction in integrated circuit cost. Due to limitations associated with existing gate-oxide thicknesses and source/drain (S/D) junction depths, scaling of existing bulk metal oxide semiconductor field effect transistor (MOSFET) devices below the 0.1 µm process generation may be difficult, if not impossible. New device structures and new materials, thus, are likely to be needed to improve FET performance.

Double-gate MOSFETs represent new devices that are candidates for succeeding existing planar MOSFETs. A FinFET is a recent double-gate structure that includes a channel formed in a vertical fin. The FinFET is similar to existing planar MOSFETs in layout and fabrication. The FinFET also provides a range of channel lengths, CMOS compatibility and large packing density compared to other double-gate structures.

Fins of existing FinFETs are conventionally formed by direct etching of the layer of material that is to form the fin channel. This conventional direct etching can lead to rough fin sidewalls and, possibly, damage to the fin sidewalls. Such roughness and/or damage can negatively impact the performance of the eventual constructed FinFET. Therefore, there exists a need for methods for forming a fin of a FinFET that avoids the use of direct etching.

DISCLOSURE OF THE INVENTION

Consistent with the present invention, a method of growing a fin of a FinFET is provided that avoids the use of direct etching. An epitaxial growth process may be employed for growing a fin within a trench of a layer of material, such as, for example, an oxide layer. By growing the fin, instead of using an etching process, the resulting fin will have a relatively damage free surface, thereby improving FinFET performance.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method of forming a fin for a FinFET. The method may include defining a trench in a layer of first material, where a width of an opening of the trench is substantially smaller than a thickness of the layer. The method may further include growing a second material in the trench to form the fin and removing the layer of first material.

According to another aspect of the invention, a method of forming a fin for a FinFET may include defining a trench in a first layer comprising a first material, the trench having a width. The method may further include growing a second material in the trench and removing the first layer to form a fin from the second material grown in the trench, where a width of the fin is substantially equal to the width of the trench.

According to a further aspect of the invention, a method may include forming a first layer comprising a first material over a buried oxide layer and forming a second layer comprising a second material over the first layer. The method may further include defining a trench in the second layer and forming a third material in the trench. The method may also include removing the first layer to form a fin from the third material, forming a third layer comprising a fourth material over exposed portions of the first layer and over the fin, and removing the third layer and portions of the first layer to leave the fin.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 3A and 3B illustrate exemplary channel definition oxide etching and photo-resist etching consistent with the invention;

FIG. 4 illustrates a cross-sectional view of epitaxial regrowth in the exemplary channel trench of FIGS. 3A and 3B consistent with the invention;

FIG. 5 illustrates a cross-sectional view of the polishing off of excess amounts of the exemplary epitaxial regrowth of FIG. 4 consistent with the invention;

FIGS. 14A and 14B illustrate exemplary channel definition oxide etching and photo-resist etching consistent with the invention;

FIG. 17 illustrates a cross-sectional view of an exemplary dry etch of the top surface of the fin of FIG. 16 consistent with the invention;

FIG. 18 illustrates a cross-sectional view of an exemplary deposition upon the top surface of the fin of FIG. 17 consistent with the invention;

FIG. 19 illustrates a cross-sectional view of exemplary oxide stripping and liner deposition consistent with the invention;

FIG. 20 illustrates a cross-sectional view of exemplary spacer etching consistent with the invention;

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims.

Consistent with the present invention, a process of growing a fin of a FinFET transistor, that avoids the use of direct etching, is provided. An epitaxial growth process may be employed, consistent with the present invention, for growing a fin within a trench of a layer of material to reduce damage to the vertical surfaces of the fin, as compared to existing etching processes. The grown fin will have a relatively damage free surface, thereby improving the performance of the FinFET in which the fin is employed.

Figure 1:
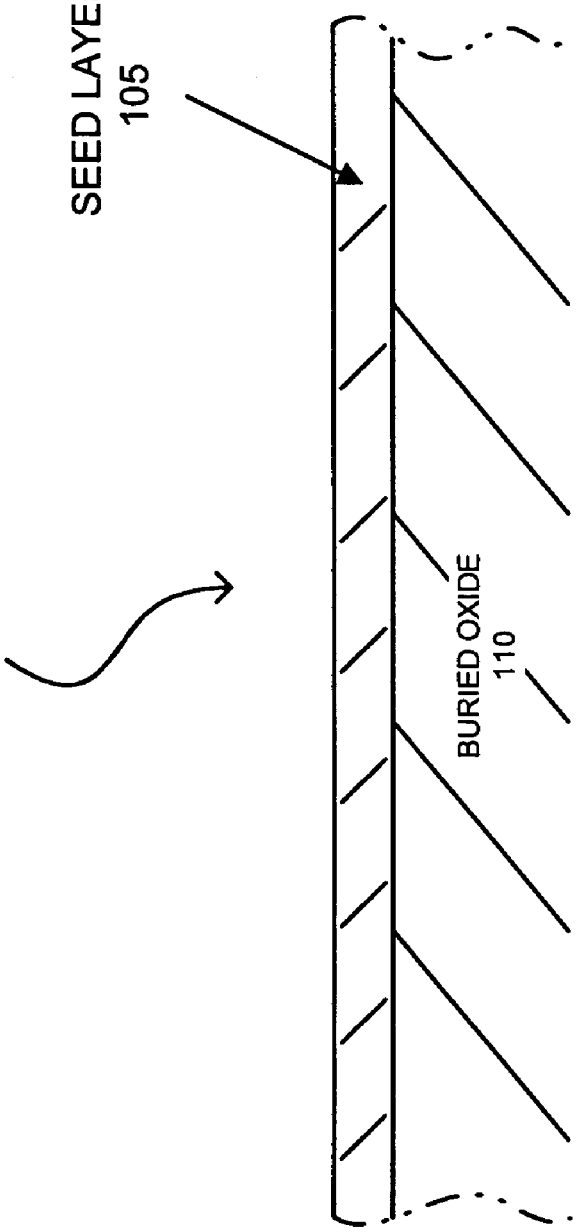
FIG. 1 illustrates a cross-sectional view of an exemplary starting substrate for forming a fin of a FinFET consistent with the present invention.

FIG. 1 illustrates a cross-section of a starting substrate 100 formed in accordance with an exemplary embodiment of the present invention. Substrate 100, consistent with the present invention, may include a silicon on insulator (SOI) structure that includes, for example, a seed layer 105 formed upon, for example, a buried oxide layer 110. Seed layer 105 may, for example, include a thin layer of silicon (Si) material. The thickness of seed layer 105 may range, for example, from about 50 Å to about 150 Å and the thickness of buried oxide layer 110 may range, for example, from about 1000 Å to about 3000 Å.

Figure 2B:
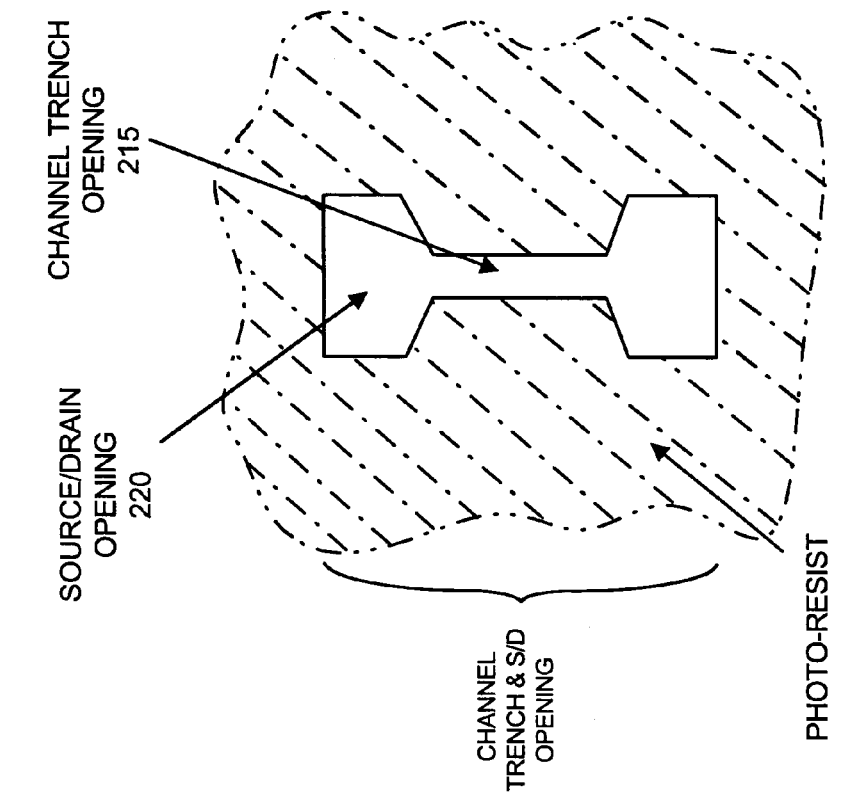
FIG. 2B illustrates a top view of the exemplary oxide and photo-resist layer of FIG. 2A consistent with the invention.
Figure 2A:
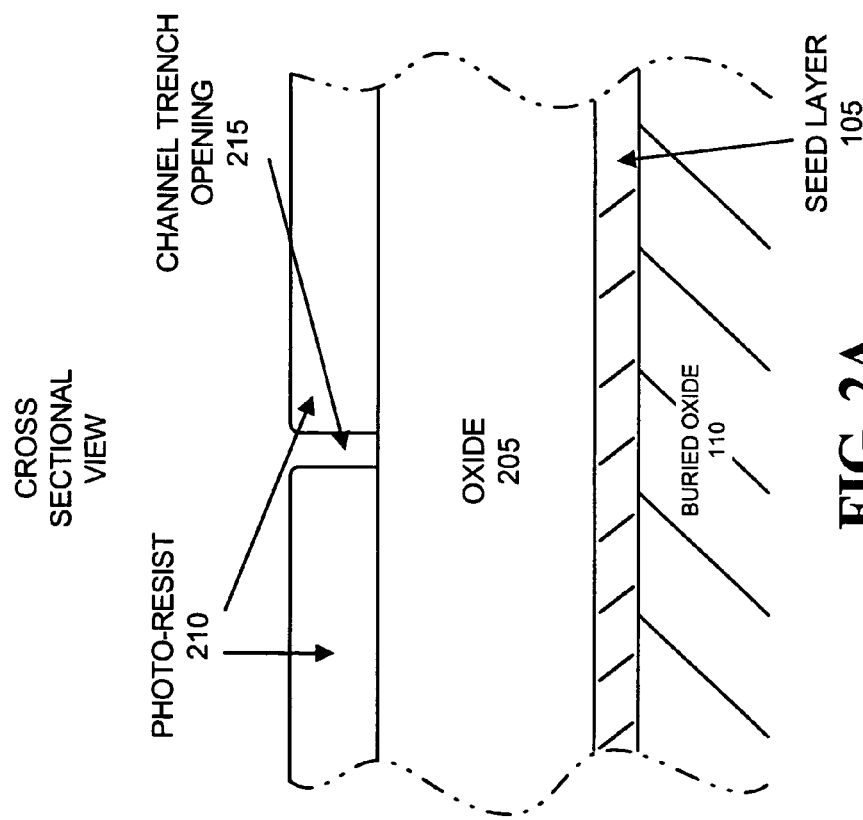
FIG. 2A illustrates a cross-sectional view of an exemplary oxide and photo-resist layer consistent with the invention.

As shown in FIGS. 2A and 2B, after forming substrate 100, an oxide layer 205 and photo-resist layer 210 may be formed on substrate 100. Oxide layer 205 may include any type of oxide material, such as, for example, silicon oxide $SiO_2$. The thickness of oxide layer 205 may range, for example, from about 800 Å to about 2000 Å. Photo-resist layer 210 may include any type of existing photo-resist material employed in conventional photolithography. After formation of oxide layer 205 and photo-resist layer 210, photolithography may be employed to form channel trench 215 and source/drain 220 openings in the photo-resist 210.

As shown in FIGS. 3A and 3B, a channel trench 305 and source/drain (S/D) trench 310 may be defined by etching oxide layer 205 using the previously prepared channel trench opening 215. Portions of oxide layer 205 that are exposed via channel trench opening 215 and source/drain opening 220 in photo-resist 210 may be etched away using any conventional etching process. During etching, oxide layer 205 may be etched down to seed layer 105.

As shown in FIG. 4, crystalline material, such as, for example, silicon, may be epitaxially regrown in channel trench 305, from seed layer 105, to produce epitaxial regrowth 405. The crystalline material may be selectively regrown such that no deposition occurs in the oxide surfaces of oxide layer 205. Excess epitaxial regrowth 405, protruding above oxide layer 205 may then be polished off, as shown in FIG. 5, to create a crystalline fin and S/D region 505 filling channel trench 305 and source/drain trench 310.

Figure 7:
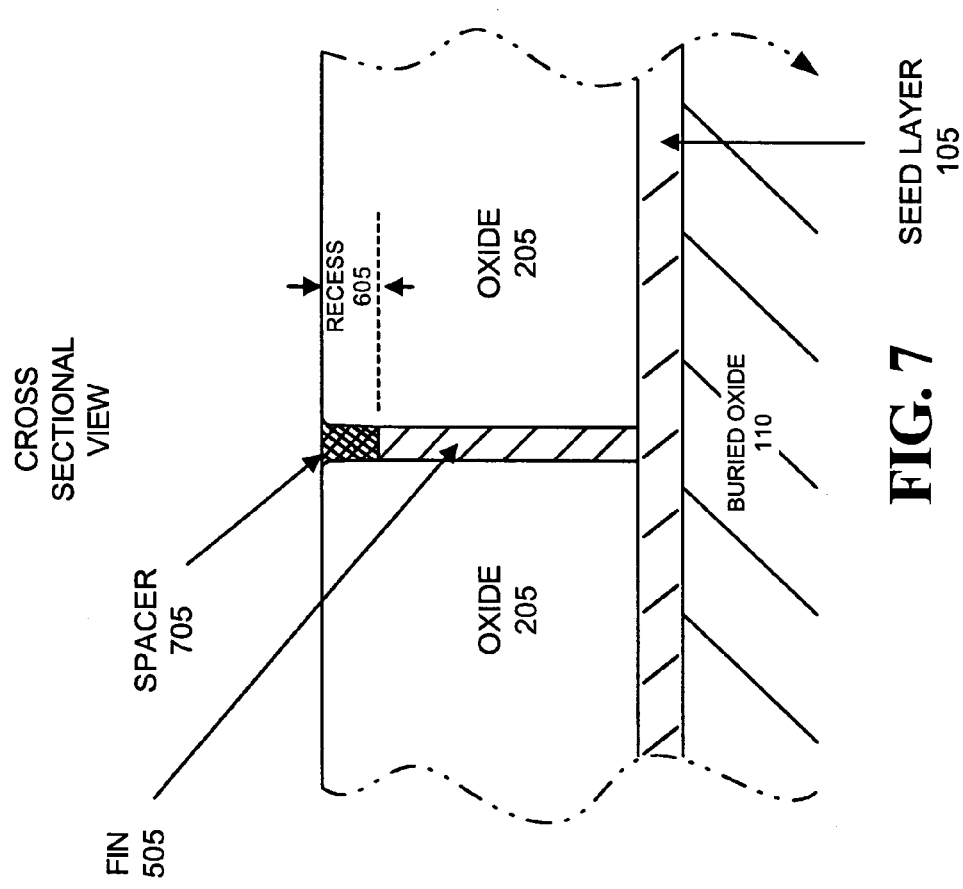
FIG. 7 illustrates a cross-sectional view of an exemplary deposition upon the top surface of the fin of FIG. 6 consistent with the invention.
Figure 6:
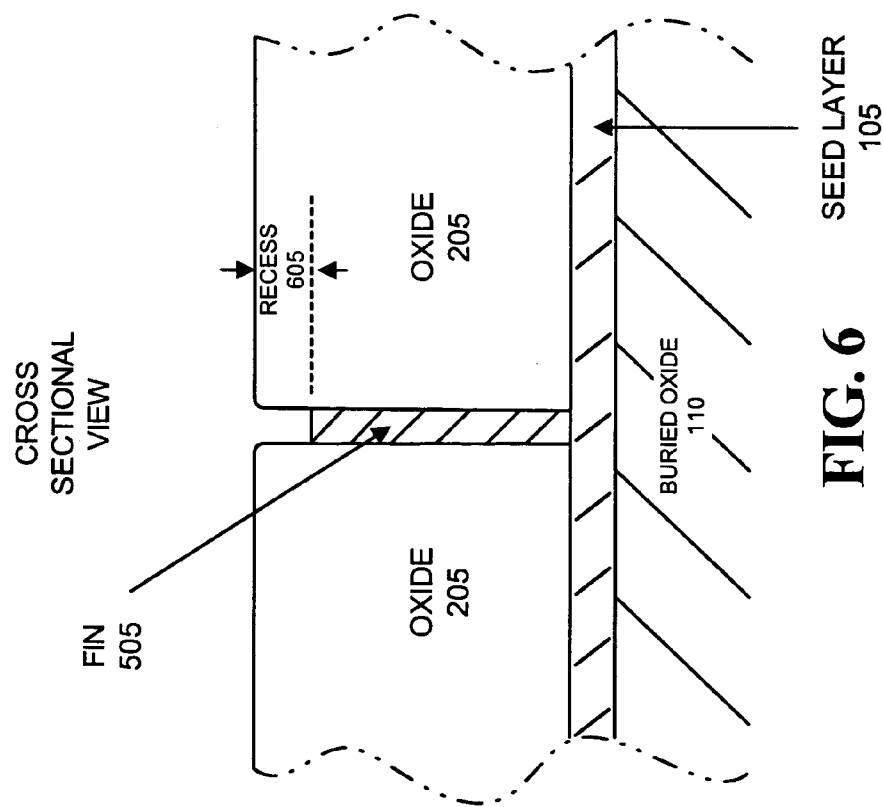
FIG. 6 illustrates a cross-sectional view of an exemplary dry etch of the top surface of the fin of FIG. 5 consistent with the invention.

As shown in FIG. 6, a slight recess 605 may be etched in fin 505 through, for example, a dry etch process. Recess 605 may be etched to approximately a depth of 100 Å. Since recess 605 may only be etched in the upper surface of fin 505, the sidewall surfaces of fin 505 will not be affected. A spacer 705 may then be formed upon fin 505, as shown in FIG. 7. Spacer 705 may include, for example, a nitride material. Any existing process, such as, for example, a conventional deposition and planarization process may be used for forming spacer 705. Alternatively, the exposed upper surface of fin 505 may be oxidized to a small extent to produce an oxide spacer 705.

Figure 9:
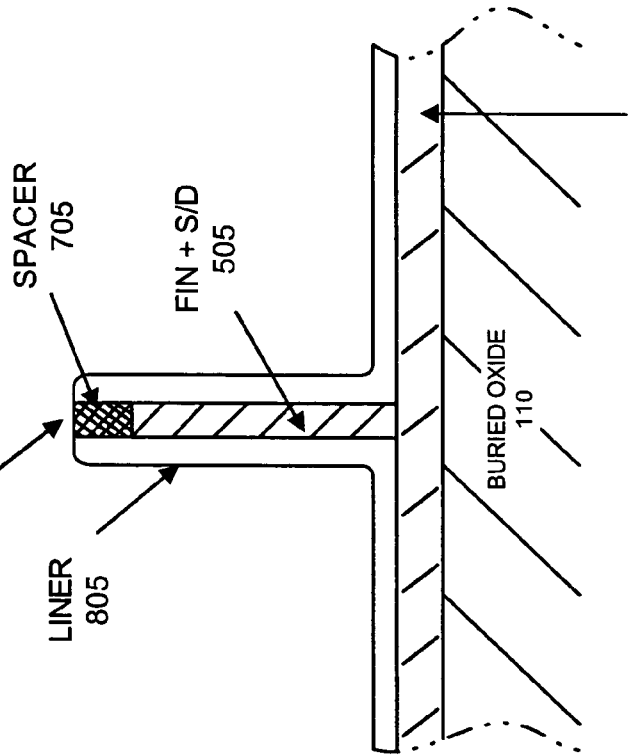
FIG. 9 illustrates a cross-sectional view of exemplary spacer etching consistent with the invention.
Figure 8:
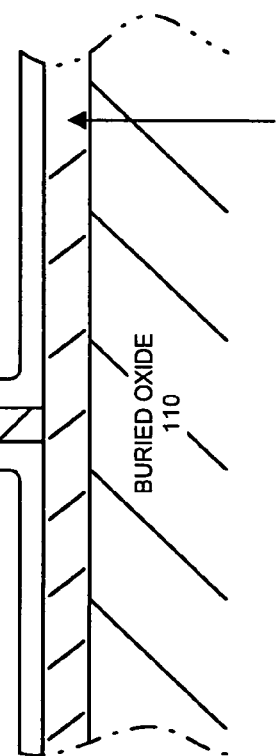
FIG. 8 illustrates a cross-sectional view of exemplary oxide stripping and liner deposition consistent with the invention.

As shown in FIG. 8, the remaining portions of oxide layer 205 may be stripped from fin and S/D 505 using, for example, an existing oxide etching process. A liner 805 may be formed upon spacer 705, the vertical surfaces of fin and S/D 505, and seed layer 105. Liner 805 may include, for example, a thin nitride or oxide layer that may be formed using existing deposition techniques. The thickness of liner 805 may range, for example, from about 50 Å to about 200 Å. As further shown in FIG. 9, after forming liner 805, a portion of liner 805, formed on spacer 705, may be removed 905 using, for example, an existing etching process to expose the upper surface of spacer 705.

Figure 11:
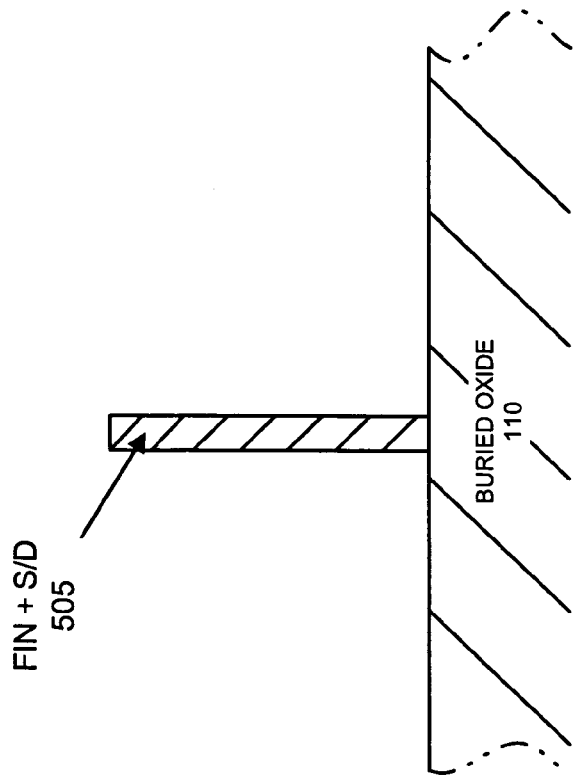
FIG. 11 illustrates a cross-sectional view of an exemplary nitride strip consistent with the invention.
Figure 10:
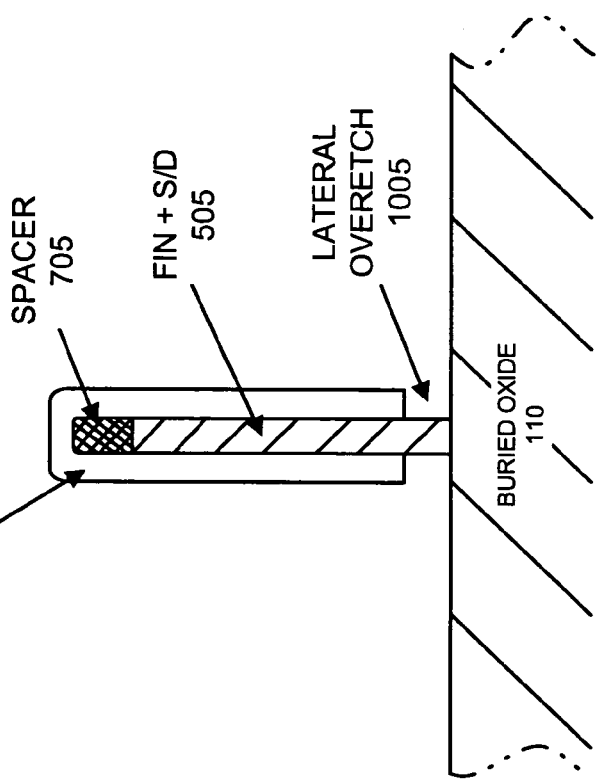
FIG. 10 illustrates a cross-sectional view of an exemplary seed etch and lateral over-etch consistent with the invention.

Seed layer 105 may be etched away, as shown in FIG. 10, using spacer 705 and liner 805 as a mask (e.g., a nitride mask). Seed layer 105 may also be laterally over-etched 1005 to expose a bottom portion of fin and S/D 505. As shown in FIG. 11, spacer 705 and liner 805 may then be stripped away (e.g., using a nitride strip) such that only fin and S/D 505 remain. Fin and S/D 505 may, thus, consistent with the present invention, be formed without damage (e.g., plasma damage) to the fin sidewalls as occurs with conventional fin etching processes. FinFETs constructed using fin and S/D 505 may, therefore, have improved performance relative to FinFETs constructed with conventionally etched fins.

Exemplary FinFET with Amorphized S/D

In another exemplary embodiment of the present invention, the source and drain regions of a FinFET may be amorphized through the implantation of dopants in the source/drain (S/D) regions. To amorphize the source and drain regions, defects may be introduced in the S/D regions, and then dopants may be implanted. The S/D regions may include, for example, Si or Ge, and the dopants may include $Xe^+$, $Ar^+$, $Kr^+$, $Ge^+$, $Si^+$ or the like. A high temperature anneal of the dopants may increase diffusion, whereas a lower temperature anneal may increase activation of the dopants. The amorphized S/D regions result in more heavily and uniformly doped S/D regions that, in turn, reduce S/D resistance and enhance FinFET currents.

Exemplary Strained Fin with Epitaxial Growth

Figure 12:
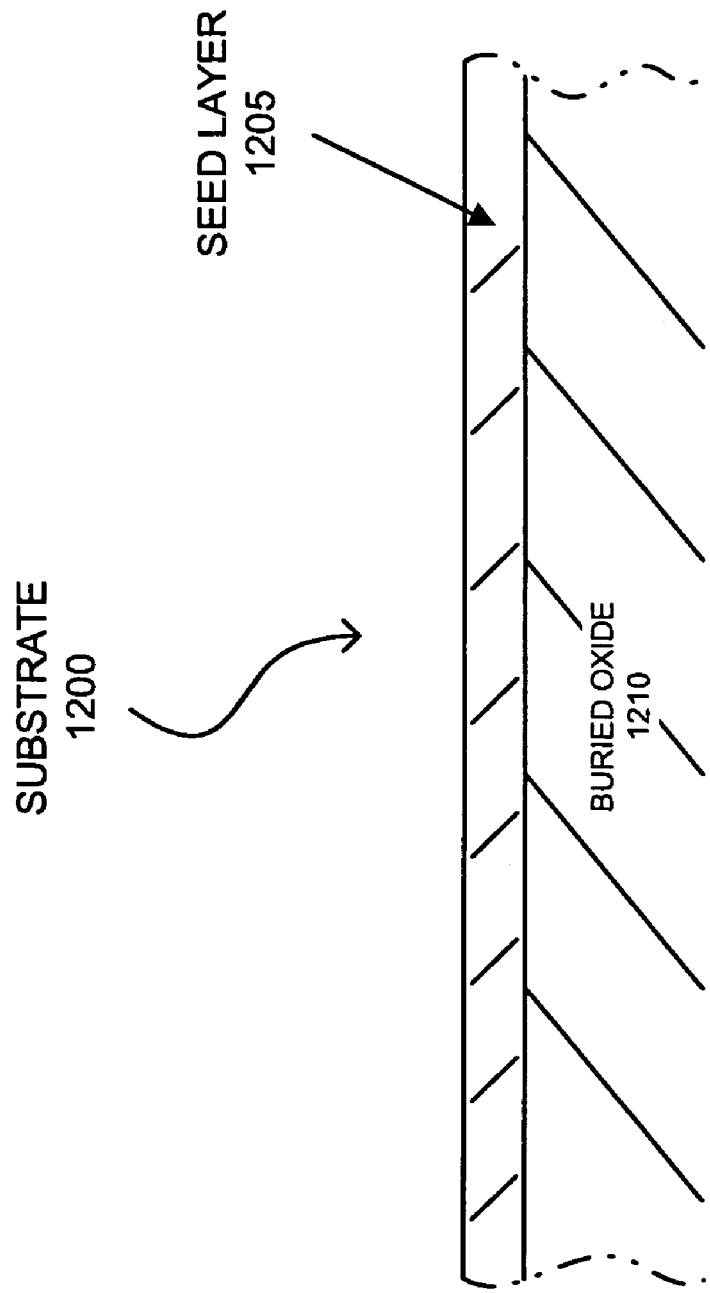
FIG. 12 illustrates a cross-sectional view of an exemplary starting substrate for forming a fin of a FinFET consistent with another exemplary embodiment of the invention.

FIGS. 12–22 illustrate an exemplary strained fin formed via epitaxial growth consistent with another embodiment of the present invention. FIG. 12 illustrates a cross-section of a starting substrate 1200 formed in accordance with an exemplary embodiment of the present invention. Substrate 1200, consistent with the present invention, may include a silicon on insulator (SOI) structure that includes, for example, a seed layer 1205 formed upon, for example, a buried oxide layer 1210. Seed layer 1205 may, for example, include a thin layer of silicon (Si) material. The thickness of seed layer 1205 may range, for example, from about 50 Å to about 150 Å and the thickness of buried oxide layer 1210 may range, for example, from about 1000 Å to about 3000 Å.

Figures 13A, 13B:
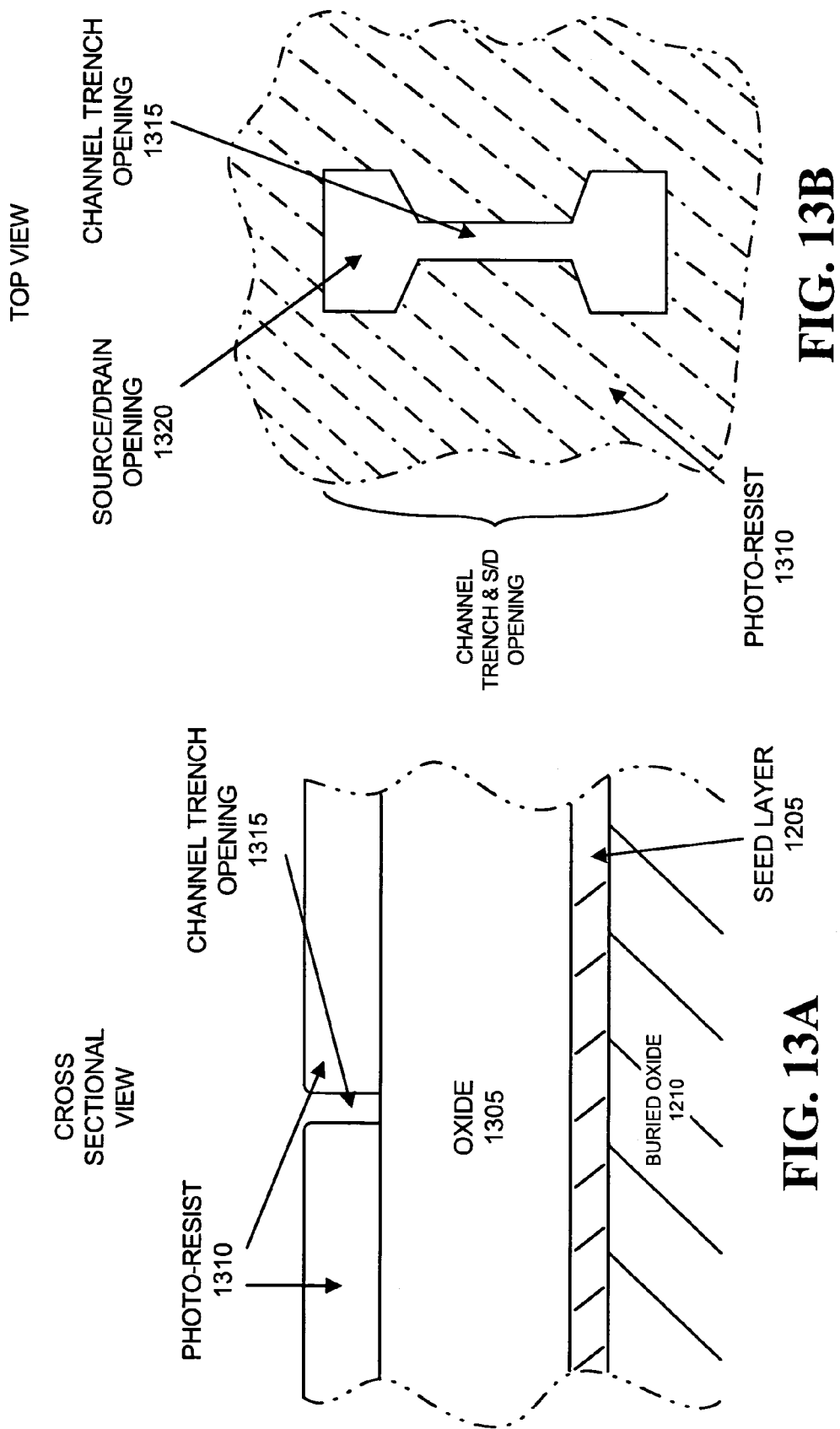
FIG. 13A illustrates a cross-sectional view of an exemplary oxide and photo-resist layer consistent with the invention.
FIG. 13B illustrates a top view of the exemplary oxide and photo-resist layer of FIG. 2A consistent with the invention.

As shown in FIGS. 13A and 13B, after forming substrate 1200, an oxide layer 1305 and photo-resist layer 1310 may be formed on substrate 120. Oxide layer 1305 may include any type of oxide material, such as, for example, silicon oxide $SiO_2$. The thickness of oxide layer 1305 may range, for example, from about 800 Å to about 2000 Å. Photo-resist layer 1310 may include any type of existing photo-resist material employed in conventional photolithography. After formation of oxide layer 1305 and photo-resist layer 1310, photolithography may be employed to form channel trench 1315 and source/drain 1320 openings in the photo-resist 1310.

As shown in FIGS. 14A and 14B, a channel trench 1405 and source/drain (S/D) trench 1410 may be defined by etching oxide layer 1305 using the previously prepared channel trench opening 1315. Portions of oxide layer 1305 that are exposed via channel trench opening 1315 and source/drain opening 1320 in photo-resist 1310 may be etched away using any conventional etching process. During etching, oxide layer 1305 may be etched down to seed layer 1305.

Figure 16:
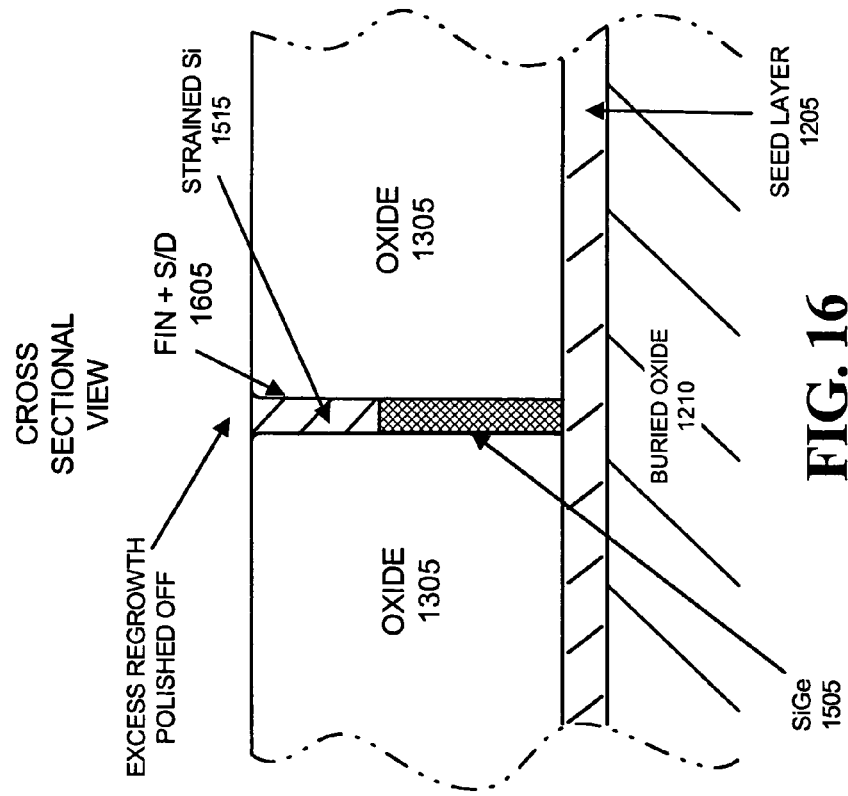
FIG. 16 illustrates a cross-sectional view of the polishing off of excess amounts of the exemplary epitaxial regrowth of FIG. 15 consistent with the invention.
Figure 15:
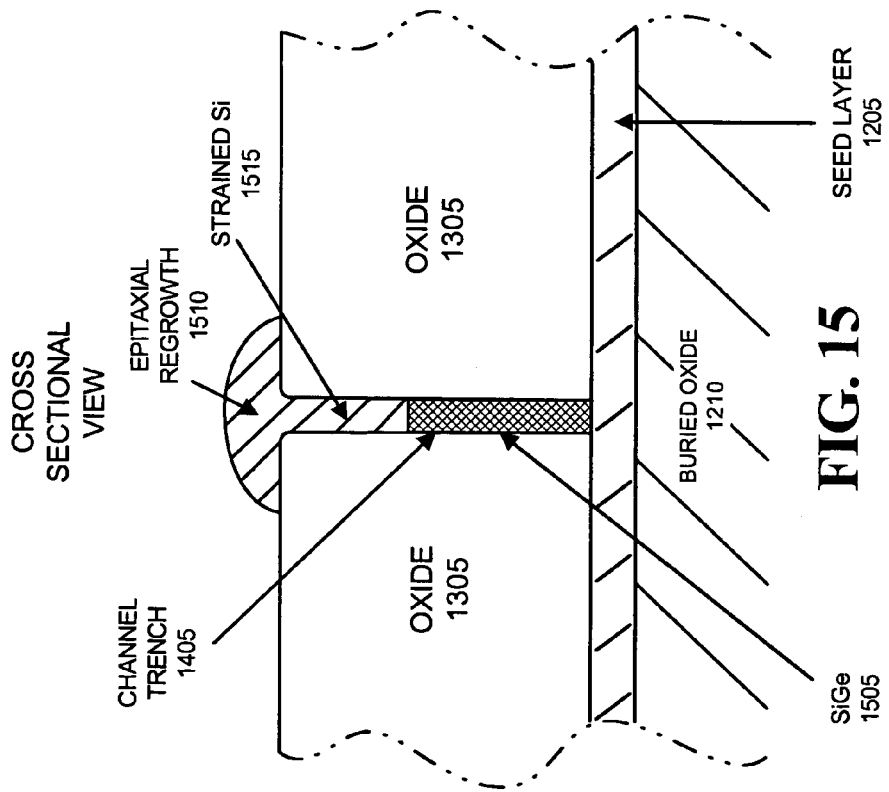
FIG. 15 illustrates a cross-sectional view of epitaxial regrowth of strained silicon in the exemplary channel trench of FIGS. 14A and 14B consistent with the invention.

As shown in FIG. 15, crystalline material, such as, for example, silicon Germanium (SiGe) 1505, may be epitaxially regrown in channel trench 1405, from seed layer 1205, to produce epitaxial regrowth 1510. As SiGe 1505 is grown in channel trench 1405, the SiGe may be gradually graded to strained Si 1515. The crystalline material may be selectively regrown such that no deposition occurs in the oxide surfaces of oxide layer 1305. Excess epitaxial regrowth, protruding above oxide layer 1305 may then be polished off, as shown in FIG. 16, to create a crystalline fin and S/D region 1605 filling channel trench 1405 and source/drain trench 1410, where fin and S/D region 1605 include SiGe 1505 graded to strained Si 1515.

As shown in FIG. 17, a slight recess 1705 may be etched in fin 1605 through, for example, a dry etch process. Recess 1705 may be etched to approximately a depth of 100 Å. Since recess 1705 may only be etched in the upper surface of fin 1605, the sidewall surfaces of fin 1605 will not be affected. A spacer 1805 may then be formed upon fin 1605, as shown in FIG. 18. Spacer 1805 may include, for example, a nitride material. Any existing process, such as, for example, a conventional deposition and planarization process may be used for forming spacer 1805. Alternatively, the exposed upper surface of fin 1605 may be oxidized to a small extent to produce an oxide spacer 1805.

As shown in FIG. 19, the remaining portions of oxide layer 1305 may be stripped from fin and S/D 1605 using, for example, an existing oxide etching process. A liner 1905 may be formed upon spacer 1805, the vertical surfaces of fin and S/D 1605, and seed layer 1205. Liner 1905 may include, for example, a thin nitride or oxide layer that may be formed using existing deposition techniques. The thickness of liner 1905 may range, for example, from about 50 Å to about 200 Å. As further shown in FIG. 20, after forming liner 1905, a portion of liner 1905, formed on spacer 1805, may be removed 2005 using, for example, an existing etching process to expose the upper surface of spacer 1805.

Figure 22:
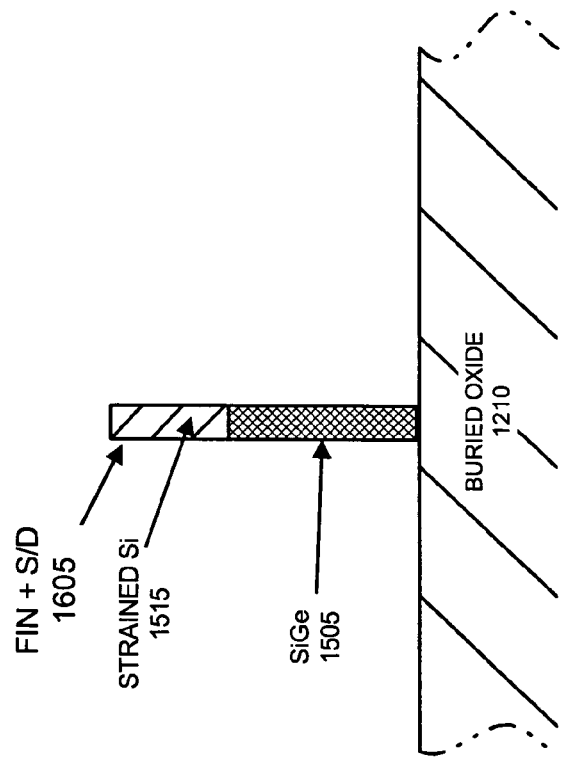
FIG. 22 illustrates a cross-sectional view of an exemplary nitride strip consistent with the invention.
Figure 21:
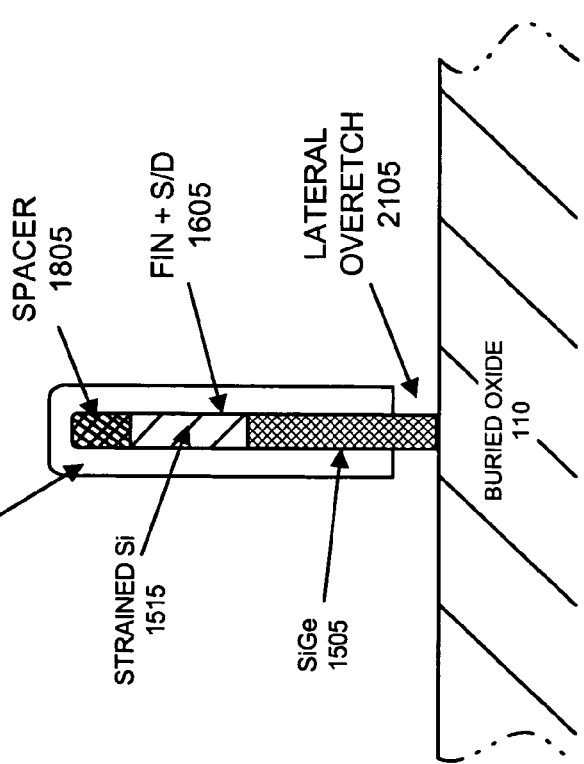
FIG. 21 illustrates a cross-sectional view of an exemplary seed etch and lateral over-etch consistent with the invention.

Seed layer 1205 may be etched away, as shown in FIG. 21, using spacer 1805 and liner 1905 as a mask (e.g., a nitride mask). Seed layer 125 may also be laterally over-etched 2105 to expose a bottom portion of fin and S/D 1605. As shown in FIG. 22, spacer 1805 and liner 1905 may then be stripped away (e.g., using a nitride strip) such that only fin and S/D 1605, including SiGe 1505 graded to strained Si 1515, remain. Fin and S/D 1605 may, thus, consistent with the present invention, be formed without damage (e.g., plasma damage) to the fin sidewalls as occurs with conventional fin etching processes. Creation of the strained Si 1515 in fin 1605 improves the carrier mobility of FinFET devices.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic and etching techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a fin for a fin field effect transistor (FinFET), comprising:
    defining a trench in a layer of first material;
    growing a second material in the trench to form the fin;
    forming a spacer on an upper surface of the fin;
    removing the layer of first material;
    forming a liner on the spacer and fin, the liner comprising a third material.

2. The method of claim 1, wherein the first material comprises an oxide.

3. The method of claim 1, wherein defining a trench comprises:
    forming the layer of first material on a substrate; and
    selectively etching the layer to define the trench.

4. The method of claim 1, wherein growing the second material comprises epitaxially growing the second material.

5. The method of claim 1, wherein removing the layer of first material comprises stripping the layer.

6. The method of claim 1, wherein forming the spacer comprises depositing a third material on the upper surface.

7. The method of claim 6, wherein the third material comprises a nitride.

8. The method of claim 1, wherein the second material comprises silicon.

9. The method of claim 1, wherein the third material comprises a nitride.

10. The method of claim 1, wherein the third material comprises an oxide.

11. The method of claim 1, further comprising:

removing the spacer and liner.

12. The method of claim 11, wherein removing the spacer and liner comprises:

stripping the spacer and liner.

13. A method of forming a fin for a fin field effect transistor (FinFET), comprising:

defining a trench in a layer of first material;

growing a second material in the trench to form the fin;

removing the layer of first material;

forming a liner on the fin, the liner comprising a third material; and removing the liner to leave the fin.

14. The method of claim 13, wherein growing the second material comprises:

epitaxially growing the second material.

15. The method of claim 13, wherein removing the liner comprises:

stripping the liner.

16. A method of forming a fin for a fin field effect transistor (FinFET), comprising:

defining a trench in a layer of first material, wherein a width of an opening of the trench is substantially smaller than a thickness of the layer;

growing a second material in the trench to form the fin; and removing the layer of first material.

17. The method of claim 16, further comprising:

forming a liner on the fin, the liner comprising a third material; and removing the liner to leave the fin.

\* \* \* \* \*